US007358645B2

(12) United States Patent
Frey

(10) Patent No.: US 7,358,645 B2
(45) Date of Patent: Apr. 15, 2008

(54) BACKING, TRANSDUCER ARRAY AND METHOD FOR THERMAL SURVIVAL

(75) Inventor: Gregg W. Frey, Issaquah, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 708 days.

(21) Appl. No.: 10/921,565

(22) Filed: Aug. 19, 2004

(65) Prior Publication Data

US 2006/0058706 A1 Mar. 16, 2006

(51) Int. Cl.
*H01L 41/08* (2006.01)

(52) U.S. Cl. ...................... 310/327; 310/322; 310/326; 310/334

(58) Field of Classification Search ................ 310/322, 310/326, 327, 334
See application file for complete search history.

(56) References Cited

U.S. PATENT DOCUMENTS 2,967,956 A * 1/1961 Dranetz et al. ............. 310/330
4,297,607 A * 10/1981 Lynnworth et al. ......... 310/334
4,382,201 A * 5/1983 Trzaskos ..................... 310/327
4,769,571 A * 9/1988 Habeger et al. ............ 310/334
6,194,814 B1 * 2/2001 Hanafy et al. .............. 310/334
2004/0002656 A1 1/2004 Sheljaskow et al.
2006/0043839 A1 * 3/2006 Wildes et al. ............... 310/327

OTHER PUBLICATIONS

U.S. Appl. No. 10/815,307, filed Apr. 1, 2004, Englund et al.
U.S. Appl. No. 10/665,334, filed Sep. 18, 2003, Barnes.
U.S. Appl. No. 10/646,222, filed Aug. 22, 2003, Oliver et al.

* cited by examiner

*Primary Examiner*—Thomas M. Dougherty

(57) ABSTRACT

Backing blocks, transducer arrays and methods are provided for thermal cycle survivability. By decoupling a portion of the backing block from a case used to contain the transducer stack, the greater thermal expansion properties of most backing blocks may be minimized. For example, a rim is formed on the backing block material. The rim is bonded to the case structure while other portions of the backing block remain free of bonding to the case structure. During thermal cycling or other temperature changes, the backing block may be less likely to expand or bulge and crack, delaminate or damage transducer elements or other transducer materials.

13 Claims, 1 Drawing Sheet

BACKING, TRANSDUCER ARRAY AND METHOD FOR THERMAL SURVIVAL

BACKGROUND

The present invention relates to backing blocks, transducer arrays and methods for survivability. In particular, a shaped backing block may avoid thermal tension damage to a transducer array during manufacturing, testing or use.

As part of development or manufacturing, transducer arrays are temperature stress tested. As part of use, similar temperature stresses are placed on a transducer array. For example, the transducer arrays are subjected to thermal variation. Due to usage, storage or shipping, the transducer may be exposed to a range of temperatures. Tests typically span a −30° to +60° Celsius temperature range. Other temperature ranges may be used. The transducer array is subjected to this range of temperatures over a number of cycles, such as 60 cycles. During use or shipping, the transducer may be subjected to various temperatures any number of times.

Differences in a thermal coefficient of expansion between different materials within a transducer stack may result in damage to the array from temperature changes. For example, piezoelectric ceramic material is very strong in compression but very weak in tension. Soft or semi-rigid backing material connected with the piezoelectric ceramic has very high thermal expansion relative to the other materials in the array. The backing block material may heave or bulge due to heat to a greater extent than the ceramic material, causing damage to the transducer array. Due to the large thermal expansion of the backing block, the piezoelectric ceramic may crack. Cracked elements have weak or less desirable acoustic response.

BRIEF SUMMARY

By way of introduction, the preferred embodiments described below include backing blocks, transducer arrays and methods for thermal survivability. By decoupling a portion of the backing block from a case used to contain the transducer stack, the greater thermal expansion properties of most backing blocks may be minimized. For example, a rim is formed on the backing block material. The rim is bonded to a case structure while other portions of the backing block remain free of bonding to the case structure. During thermal cycling or other temperature changes, the backing block may be less likely to expand or bulge and crack, delaminate or damage transducer elements or other transducer materials.

In a first aspect, an ultrasound transducer is provided for thermal survival. Transducer material is connected with a case. A backing block has a top, bottom and sides. The top connects with the transducer material. Less than 50% of the sides of the backing block connect with the case or other structure.

In a second aspect, a method is provided for connecting transducer components for thermal survival. An array of elements is bonded to a backing block. The backing block is positioned at least partially within a case. Less than 50% of the surface area of the backing block is bonded to the case.

In a third aspect, a backing block is provided for thermal survivability in an ultrasound transducer array. A body of acoustically absorbing material has a top, bottom and sides. A rim connects with at least a portion of the sides of the body. The rim extends from the sides such that a first area including the rim in cross-section perpendicular to an axis extending between the top and bottom is greater than a second area free of the rim in cross-section also perpendicular to the axis. The second area is spaced from the first area along the axis.

The present invention is defined by the following claims, and nothing in this section should be taken as a limitation on those claims. Further aspects and advantages of the invention are discussed below in conjunction with the preferred embodiments.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Stress caused by a mismatch of thermal coefficients of expansion between a backing block and other materials of a transducer stack or array are minimized by decoupling at least a portion of the backing block from any support material. For example, about 70-80% of the sides of the backing material are decoupled from a rigid case surrounding the transducer stack. The full depth of the backing block is maintained for absorbing acoustic energy from the transducer material.

Figure 1:
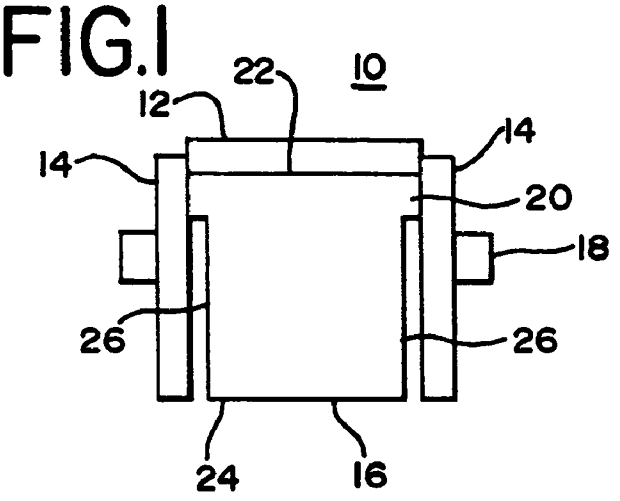
FIG. 1 is a cross-sectional diagram of one embodiment of a transducer stack with a backing block provided for thermal survivability.
Figure 2:
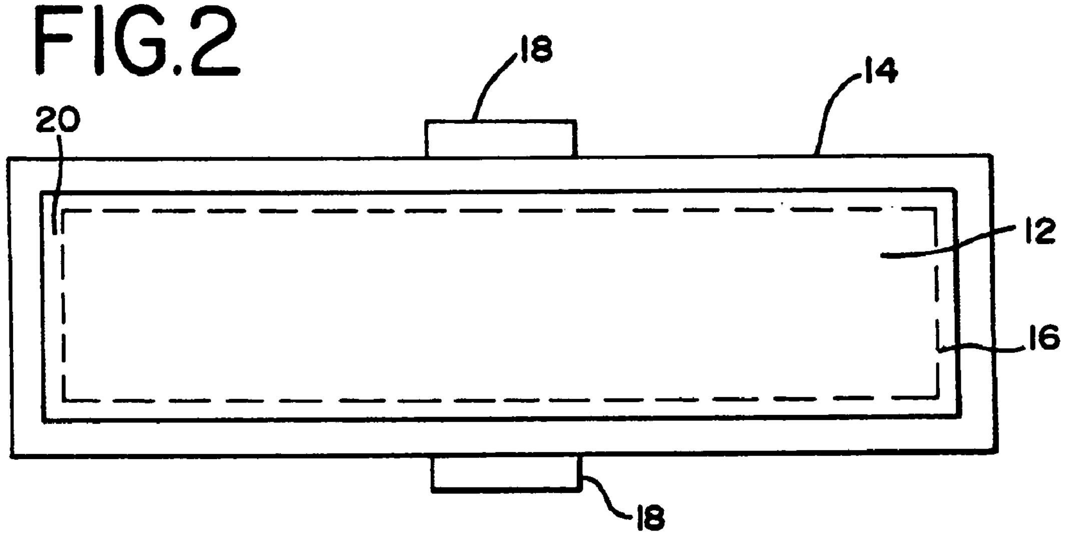
FIG. 2 is a top view of one embodiment of the transducer stack of FIG. 1.

FIGS. 1 and 2 show two different views of one embodiment of an ultrasound transducer 10 for thermal survival. The transducer 10 includes transducer material 12, a support case 14 and a backing block 16. Additional, different or fewer components may be provided, such as providing matching layers, flexible circuits, wire bonds, a lens, a transducer probe housing, combinations thereof or other now known or later developed transducer stack materials. As another example, the transducer 10 is free of or does not include the case 14.

The transducer material 12 is a slab, plate or block of piezoelectric ceramic. Alternatively, the transducer material 12 is a composite transducer material, capacitive membrane, micro electromechanical structures, combinations thereof or other now known or later developed material or structure for transducing between acoustical and electrical energies. The transducer material 12 is diced or otherwise separated to form an array of transducer elements, such as a 1, 1.25, 1.5, 1.75 or multidimensional array of transducer elements. The transducer material 12 is formed into elements prior to or after being positioned within the case 14.

The case 14 is graphite, but other rigid or semi-rigid materials may be used, such as metals, plastics and combinations thereof. The case 14 is shaped as a box structure with an open top and bottom. Oval or shapes with other numbers of sides may be used. Wider or longer shapes may be used. In alternative embodiments, a portion or entirety of the bottom is also enclosed. Vents, holes, gaps or other structures may be formed within or through the walls of the case 14. Alternatively, the walls of the case 14 are solid. In one embodiment, one or more grooves or divots within the case 14 are used for holding the transducer material 12 and/or the backing block 16 in a desired position relative to case 14. For example, an extension or a depression within the backing block 16 along an area of contact with the case 14 mates with a corresponding depression or extension in the case 14. The case 14 surrounds the sides of the transducer material 12 and the sides of backing block 16. Alternatively, the case surrounds a portion of the sides of the transducer material 12 and the backing block 16. As shown in FIG. 1, the case 14 has a height corresponding to the height of the transducer material 12 and the backing block 16. Either or both of the transducer material 12 and the backing block 16 may extend beyond the case 14, such as the transducer material 12 shown in FIG. 1. In one embodiment, the case 14 extends just to or a little past the rim 20 of the backing material 16. The case 14 assists in manufacture and protection of the transducer material 12 and backing block 16.

The case 14 includes one or more tabs 18. The tabs 18 are shaped and sized for mounting with other structures, such as a probe housing. In one embodiment, the tabs 18 are formed as a unitary structure with the case 14, but may alternatively be otherwise connected or bonded to the case 14. Tabs 18 are of the same or different material than the case 14. The tabs 18 may include one or more holes or other structures for mounting the case to the transducer probe housing.

The backing block 16 is a soft or semi-rigid material. In one embodiment, a composite of hard or soft epoxy with tungsten powder, mica, combination thereof or other filler materials is used. Other unitary or composite structures may be used. The material is selected to absorb acoustic energy behind the transducer material 12 and efficiently damp the acoustics to minimize artifacts for imaging. The backing block material is selected to damp by absorption rather than scattering. The acoustically absorbing material may have a greater thermal expansion coefficient than the transducer material 12. Alternatively, a similar or lesser thermal expansion coefficient is provided. Alternatively, the backing material 16 is shaped to provide for scattering away from the transducer material 12.

The backing block 16 is a body of acoustically absorbing material having a top 22, a bottom 24 and sides 26. The bottom 24, sides 26, or top 22 may include divots, holes or other structures. The top 22 is flat or curved to accommodate the shape or structure of the transducer material 12. The top 22 has a same or similar surface shape and/or texture as the bottom of the transducer material 12. The depth of the backing block 16 or height of the sides 26 is selected as a function of the ability of the backing block 16 to acoustically damp or absorb acoustic energy while minimizing secondary echoes. In one embodiment, the height of the sides 26 is less than half-an-inch, such as being about one-third of an inch. Greater or lesser heights of the sides 26 and depths of the backing block 16 may be provided.

The top 22 of the backing block 16 connects with the transducer material 12. In one embodiment, the backing block 16 is bonded directly to the transducer material 12. Alternatively, the top 22 connects with the transducer material 12 through one or more other layers of material, such as a flexible circuit, conductors or electrodes.

The backing block 16 includes a rim 20 around or connected with a portion of the sides 26. The rim 20 is formed of acoustically absorbing material, such as forming the rim 20 and the remainder of the backing block 16 as a singular or unitary structure of the same material or materials. The rim 20 is positioned adjacent to the top 22, but may be positioned lower or spaced away from the top 22. The rim 20 is formed completely around the sides 26 of the backing block 16, but may have gaps or only extend partially around the sides 26. The rim has a height along the sides 26 or a depth that is about one-third of the total height of the sides 26 or depth of the backing block 16. Greater or lesser heights may be provided. By being formed along a third or upper third of the height of the sides 26 of the backing block 26, the rim 20 covers less than 50% of the surface area of the sides 26, such as covering about a third of the sides. Greater or lesser amounts of coverage may be provided. The rim 20 has a depth or height sufficient to allow the depth of kerfs for providing separation of elements and/or electrodes without extending beyond the height of the rim 20.

The rim 20 extends from the sides 26 such that an area that includes the rim in cross-section (e.g. a cross-section through the rim 20 along all sides 26 of the backing block 16 orthogonal to the plane of the FIG. 1) perpendicular to an axis extending between the top 22 and the bottom 24 is greater than an area of the backing block 16 that is free of the rim 20 but also perpendicular to the same axis. The area free of the rim 20 is spaced away from the area including the rim along the same axis. The rim 20 adds or contributes to the additional area. The other portions of the side 26 are formed by milling away, molding, or otherwise removing a portion of the backing block material 16 to form the rim 20. The top surface 22 of the backing block 16 includes the portion of the rim 20. The top surface 22 is of a same or full aperture size of the transducer material 12. An area spaced from the top 22 but parallel to the top 22 is lesser in cross-section than the area of the top 22.

The rim 20 connects with the case 14. In one embodiment, the connection is a direct connection, but indirect connections through one or more other materials may be provided. The rim 20 connects with the case 14 by bonding, but a pressure fit or other mounting or latch mechanisms may be used. The rim 20 is also connected with a portion of the transducer material 12, such as through bonding or sintering. Since the rim 20 covers less than 50% of the sides 26 of the backing block 16, less than 50% of the sides 26 connects with the case 14. For example, less than 30% of the sides 26 connect with the case 14. In one embodiment, about 20% of the sides 26 connect with the case 14. The surface area of the sides of the rim 20 correspond to the portion of the sides 26 of the backing block 16 for connection with the case 14. The rim extends about 1 to 1 ½ hundredths of an inch from the sides 26. The gap between the case 14 and the sides 26 has a similar extent. Greater or lesser extents may be provided. Air, Teflon, a film, or other materials may fill the gap between the sides 26 and the case 14.

In an alternative embodiment, contact from the sides 26 with the case 14 is minimized by having a case 14 that extends less than the height of the backing block 16. The backing block 16 may be formed with or without the rim 20 where the case 14 has a limited extend. By limiting the height of the case 14, the amount of the sides 26 of the backing block 16 in contact with the case 14 is controlled.

Figure 3:
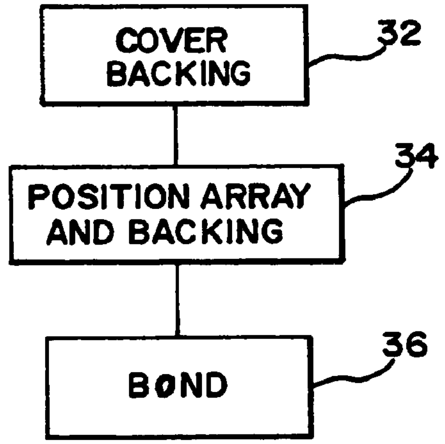
FIG. 3 is a flow chart diagram of one embodiment of a method for connecting transducer components for thermal survival.

FIG. 3 shows one embodiment of a method for connecting transducer components for thermal survival. The method uses the components shown above in FIGS. 1 and 2, but other components may be used. Additional, different or fewer acts than shown in FIG. 3 may be used, such as performing acts 34 and 36 without act 32.

In act 32, a portion of the backing block is covered prior to bonding the backing block to a case or other support structure. The covering prevents bonding of the covered portion of the backing block to the case or support structure. For example, a non-bonding film, such as Teflon, is wrapped around the backing block below the rim. The film may extend along a portion of the height or the entire height of the backing block other than the rim or bonding portion. In one embodiment, the film is slit or cut at the corners of the backing block so that the film lies against the backing block. Alternatively, the film is wrapped without any cuts. The covering may be thick enough to fill a space between backing block and the case, but thinner coverings may be used in other embodiments. The covering prevents or limits an amount of bonding of the backing block to the case. The covering acts to prevent or reduce a gap between the backing block and the case from filling with bonding material.

In act 34, the transducer material or array and backing block are positioned. The backing block is positioned at least partially within a case. The sides of the backing block are at least partially surrounded with the case. Alternatively, less than all of the sides are covered with the case. The backing block is machined or otherwise formed to have a rim structure. The rim on the backing block is placed in contact with the case. Portions of the backing block other than the rim are free of contact with the case. In alternative embodiments, other portions of the backing block contact the case. The rim and other portion of the backing block forming a top surface are a full aperture size of the transducer material, such as completely filling in cross-section the case or matching a size and shape to the transducer material. Larger or smaller relative surface areas may be provided. Spaced away from a top surface, the backing block has a region with a lesser area in cross-section than the top surface, full aperture size or even a larger size where the case expands outward or is not around a portion of the backing.

The array or transducer material is also positioned within the case. In one embodiment, the backing block and transducer material are stacked together within the case. In alternative embodiments, the array or transducer material is bonded to the backing block and then both are positioned within the case.

In act 36, bonding is performed. The array of elements or transducer material is bonded to the backing block. The backing block and/or the transducer material are bonded to the case. In one embodiment, the bonding of the transducer material to the backing block happens before or after bonding the backing block to the case. In alternative embodiments, the transducer material, backing block and case are bonded together in a same step. Due to the rim, shape of the backing block or relative positioning of the backing block to the case 14, less than 50% of a surface area of the backing block is bonded to the case. For example, only the rim of the backing block is bonded to the case. In one embodiment, less than 30% of the backing block is bonded to the case. An air or filled gap is provided between the backing block and the case for at least 50% of the surface area of the sides of the backing block. Other relative areas of bonding versus areas free of bonding of the backing block to the case may be provided. The Teflon or other covering may limit the bonding of the backing block to the case. Alternatively, a pressure fit is used with limited or little leaking of bonding agent, allowing an air gap free of bonding of the backing block to the case.

After bonding, the transducer material is diced. Matching layers may be positioned on the transducer material prior to or after bonding. In alternative embodiments, the dicing is performed prior to bonding of the backing to the case. Lensing is also performed at after the bonding, but may be performed prior to the bonding in other embodiments.

The covering remains within the transducer stack. Alternatively, a portion or all of the covering is removed, forming an air gap between the backing block and the case except where the backing block bonded at the rim section or other area to the case and the electrodes or transducer material. The covering is removed by pulling the covering out using tweezers or other instruments.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

I claim:

1. An ultrasound transducer for thermal survival, the ultrasound transducer comprising:

transducer material;

a case connected with the transducer material; and a backing block having a top, bottom and sides, the top connected with the transducer material and less than 50 percent of the sides connected with the case.

2. The ultrasound transducer of claim 1 wherein the case surrounds the sides of the backing block.

3. The ultrasound transducer of claim 1 wherein the backing block has a rim around at least a portion of the sides adjacent to the top, the rim connected with the case.

4. The ultrasound transducer of claim 3 wherein the rim is bonded to the case and the top is bonded to the transducer material.

5. The ultrasound transducer of claim 3 wherein the top of the backing block includes a surface of the rim, the top being a full aperture size of the transducer material, the backing block having a region spaced from the top with a lesser area in cross section parallel to the top than the top.

6. The ultrasound transducer of claim 1 wherein less than 30 percent of the sides connects with the case.

7. The ultrasound transducer of claim 1 wherein about 20 percent of the sides connects with the case.

8. The ultrasound transducer of claim 1 wherein air separates the case from the sides for at least 50 percent of the sides.

9. The ultrasound transducer of claim 1 wherein the transducer material comprises an array of piezoelectric ceramic elements, the case comprises a rigid structure surrounding sides of the array and the sides of the backing block, and the backing block comprises a semi-rigid material with a greater thermal expansion than the piezoelectric ceramic.

10. A backing block for thermal survival in an ultrasound transducer array, the backing block comprising:

a body of acoustically absorbing material, the body having a top, a bottom and sides;

a rim connected with at least a portion of the sides, the rim extending from the sides such that a first area including the rim in cross-section perpendicular to an axis extending between the top and the bottom is greater than a second area free of the rim in cross-section perpendicular to the axis, the second area spaced from the first area along the axis.

11. The backing block of claim 10 wherein the rim surrounds the sides adjacent to the top.

12. The backing block of claim 10 wherein the rim comprises acoustically absorbing material, the rim and body being a singular structure.

13. The backing block of claim 10 wherein the rim covers less than 50 percent of a surface area of the sides.

* * * * *